United States Patent

Miyashita

[11] Patent Number: 5,525,205
[45] Date of Patent: Jun. 11, 1996

[54] PROCESS FOR FORMING CIRCUIT WITH LASER

[75] Inventor: Takayuki Miyashita, Shizuoka, Japan

[73] Assignee: Polyplastics Co., Ltd., Japan

[21] Appl. No.: 292,823

[22] Filed: Aug. 19, 1994

[30] Foreign Application Priority Data

Aug. 26, 1993 [JP] Japan .................. 5-211372

[51] Int. Cl.⁶ .................................................. C25D 5/02
[52] U.S. Cl. .................. 205/126; 205/125; 205/136; 205/221; 205/917; 205/918
[58] Field of Search ........................ 205/122, 125, 205/126, 136, 221, 917, 918

[56] References Cited

U.S. PATENT DOCUMENTS

| | | | |
|---|---|---|---|
| 4,081,653 | 3/1978 | Koo et al. | 219/121 LM |
| 4,898,648 | 2/1990 | Cusano | 204/15 |
| 4,943,346 | 7/1990 | Mattelin | 156/651 |

FOREIGN PATENT DOCUMENTS

| | | |
|---|---|---|
| 0361192 | 4/1990 | European Pat. Off. . |
| 0543045 | 11/1991 | European Pat. Off. . |
| 1-83391 | 3/1989 | Japan . |

OTHER PUBLICATIONS

Patent Abstracts Of Japan, vol. 14, No. 320 (E-0950) 10 Jul. 1990, abstract of JP-A-02 105 596(Toyama Nippon Denki KK) 18 Apr. 1990.

*Primary Examiner*—John Niebling
*Assistant Examiner*—William T. Leader
*Attorney, Agent, or Firm*—Nixon & Vanderhye

[57] ABSTRACT

A process for forming an electrical circuit component includes forming an initial metal layer on a surface of a synthetic plastics substrate, and irradiating the initial metal layer with laser light along a closed path so as to remove the initial metal layer therealong. The closed path irradiated by the laser light thereby establishes an insulating region covered by a first portion of the initial metal layer which is bounded by the closed path, and a conducting region covered by a second portion of the initial metal layer which surrounds the closed path and the insulating region established thereby. A further metal layer is then formed over the second portion of the initial metal layer of the conducting region. The first portion of the initial metal layer of the insulating region may thus be removed to thereby expose a corresponding surface portion of the synthetic plastics substrate.

8 Claims, 2 Drawing Sheets

PROCESS FOR FORMING CIRCUIT WITH LASER

FIELD OF THE INVENTION

The present invention relates to a process for forming a conductive circuit on the surface of a molded synthetic resin substrate, and to a process for efficiently producing a molding having an accurate conductive circuit on its surface, which is used as a circuit component in the fields of electrical and electronic equipment.

DESCRIPTION OF THE RELATED ART

Various processes for forming a circuit on the surface of a molded synthetic resin substrate are known. For example, one conventional process includes performing double molding of two types of materials differing in platability and selectively plating a circuit portion utilizing that platability difference between the circuit portion and other portions to thereby form a metallic circuit. This conventional process is complicated and wasteful because molding must be performed twice. Moreover, it is difficult to achieve a high adherence between two types of resins as molding materials, so that problems are likely to occur, such as the infiltration and residence of a plating solution in a molded item.

Another conventional circuit forming process wherein a photoresist is applied comprises numerous steps which include application of a resist, exposure to light in a circuit pattern, development of the pattern, etching of copper and peeling of the resist to thereby render the process complicated. When it is intended to form a three-dimensional conductive circuit on the surface of a molding of a three-dimensional configuration, the intended circuit can be prepared to some satisfaction by tile exposure to projected parallel rays. However, the accuracy thereof is a problem, and there is a limit in the above process, depending on the three-dimensional configuration of the molding as a substrate.

In recent years, circuit forming processes in which laser beams are employed are being developed, which include, for example, one comprising first forming a metal film having a thickness satisfactory for use as a conductive circuit on the surface of a molding and scattering off the metal film at portions other than the conductive circuit with laser beams to thereby directly obtain a conductive circuit (Japanese Patent Laid-Open No. 83391/1989). This process requires neither double molding nor resist application to thereby render the process very simple. However, this process has a drawback in that the conductor metal layer for use in the process must have a relatively large thickness (e.g., 10 μm) so as to exhibit satisfactory conductivity in a circuit, thereby rendering it requisite to increase the output of laser beams at the time of removing unneeded portions of the metal layer with laser beams, with the result that the synthetic resin molding as the substrate is damaged to gravely deteriorate its appearance configuration and that the synthetic resin is carbonized to cause its insulation to be unsatisfactory.

Further, a process has been proposed in which a thin metal film is formed on the surface of a molding, the metal film is removed at its portions other than conductive circuit portions to thereby form a circuit pattern and, thereafter, electroplating is performed to thereby form a conductive circuit. In this process, the synthetic resin is irradiated with laser beams having their output lowered, so that no carbonization of the synthetic resin will occur to thereby avoid the problem of insulation. However, when insulating portions having a large area are formed by this process, the problems of prolonged laser irradiation time and poor productivity and economy occur because all of the portions to be formed into insulating portions must be irradiated with laser beams.

SUMMARY OF THE INVENTION

The present invention is generally directed towards resolving the above problems in connection with a process which is free from the drawbacks of the prior art and can accurately form a circuit, especially a conductive circuit with the use of laser beams, on a molding of a complicated configuration by a simple procedure. More specifically, the surface of a molding of a synthetic resin is provided with a metal layer having its thickness limited to a specified value or less so as to be in the form of a thin film layer. Thereafter, the contour of insulating portions is irradiated with laser beams. This permits removal of unneeded metal layer portions with laser beams having a lower output and formation of a conductive circuit within a short time without detriment to the substrate resin. Further, it has been found that providing the resultant conductive circuit pattern with a metal layer having a desired thickness by electroplating, followed by removal of the thin metal film layer at the insulating portions by flash etching, permits relatively simply forming a desired conductive circuit and insulating portions having a large area without detriment to the appearance, configuration and insulating properties. The present invention has been completed on the basis of the above findings.

Thus, the present invention provides a process for forming a circuit with a laser, characterized by metallizing the surface of a molding of a metallizable synthetic resin according to any of the chemical plating, sputtering, vacuum evaporation, ion plating, transfer and conductive agent coating methods to form a thin metal film having a thickness of 0.2 to 2 μm, irradiating the metal film surface with laser beams along the contour of a portion to be formed into an insulating circuit to remove the irradiated metal film so that the insulating circuit portion is surrounded by a closed insulating circuit, performing electroplating on a portion to be formed into a conductive circuit to form a circuit having a desired thickness, and performing flash etching with an etchant to remove the thin metal film remaining on the insulating circuit portion in the preparation of a conductive circuit on the surface of a molding of a synthetic resin, and a component having a conductive circuit formed therein, which is produced by the above process.

BRIEF DESCRIPTION OF THE DRAWINGS

In FIGS. 1 to 5, numeral 1 refers to a molding as a substrate, 2 refers to a thin copper film formed by chemical copper plating, 3 refers to a conductive circuit pattern formed by irradiation with laser beams, 4 refers to a chemical copper plating layer covering an insulating portion formed by irradiation with laser beams, 5 refers to a conductive circuit formed by electroplating with copper, and 6 refers to laser beams.

DETAILED DESCRIPTION OF THE INVENTION

The process of the present invention will be described below in due order with reference to the drawings.

The molding to be employed as a substrate in the present invention may be composed of either a thermoplastic or thermosetting resin, as long as it is a synthetic resin to which a thin metal film can strongly adhere. It is desired that the resin have high heat resistance and excellent mechanical strength, because the molding undergoes severe treatments, such as soldering. The resin is preferred to be an injection-moldable thermoplastic resin from the viewpoint of mass production. Examples of the preferred resins include aromatic polyesters, polyamides, polyacetals, polyarylene sulfides, polysulfones, polyphenylene oxide, polyimides, polyether ketones and polyarylates and compositions thereof. Liquid crystal polymers (e.g., liquid crystal polyesters and polyester amides) and polyarylene sulfides are particularly preferred because of their high melting points, high strengths, high rigidities and moldabilities. However, these never limit the resins suitable for use in the present invention. According to necessity, appropriate substances such as etchability increasing agents may be added to the material of the molding in order to improve the adherence of the thin metal film.

The molding as a substrate (FIG. 1) can be obtained by, for example, injection molding. Chemical etching with an acid, an alkali or other agents or physical surface treatment such as corona discharge or plasma treatment may be applied to the surface of the molding in order to improve the adhesion between the molding surface and the thin metal film.

Figure 2:
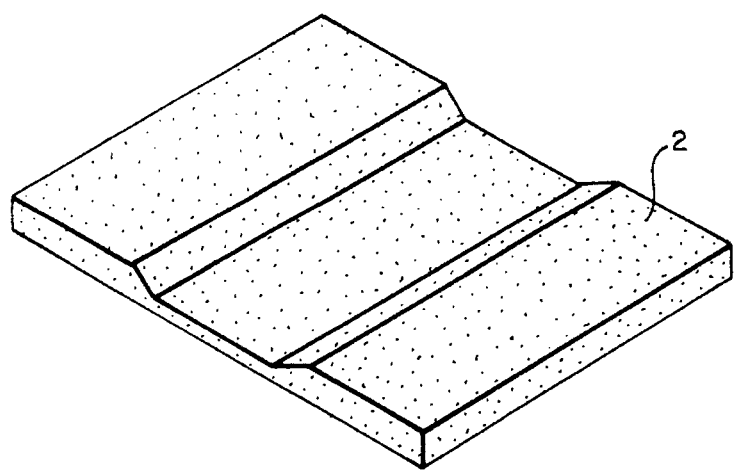
FIG. 2 is a perspective view of the substrate molding of FIG. 1 having its surface provided with a thin copper film by chemical copper plating.

Subsequently, the surface of the molding is metallized to thereby form a thin metal film thereon (FIG. 2). The thickness of the thin metal film thus formed is especially important. When the thickness is too large, the circuit pattern formation with laser beams in the ensuing step requires laser beams having their output intensified disadvantageously, thereby causing the molding as the substrate to suffer from damage as mentioned above. On the other hand, when the thickness of the metal film is too small, the electroplating processability thereof is hampered in the step of forming a metal layer having a thickness satisfactory for use as a conductive circuit by electroplating. Therefore, the thickness of the thin metal film superimposed on the surface of the molding as the substrate is in the range of 0.2 to 2 μm, preferably 0.3 to 1 μm. When the thickness is in the above range, advantageously, not only can the circuit pattern formation with laser beams be accurately carried out at a relatively low laser output without detriment to the substrate molding, but also the conductivity of the metal film as required for electroplating in the final circuit formation is maintained. This metal film can be formed by any of the conventional chemical plating, sputtering, vacuum evaporation, ion plating, transfer, conductive agent coating and other appropriate methods. Of these, the chemical plating (electroless plating), sputtering, vacuum evaporation and ion plating are preferred in order to form a uniform thin metal film.

Figure 3:
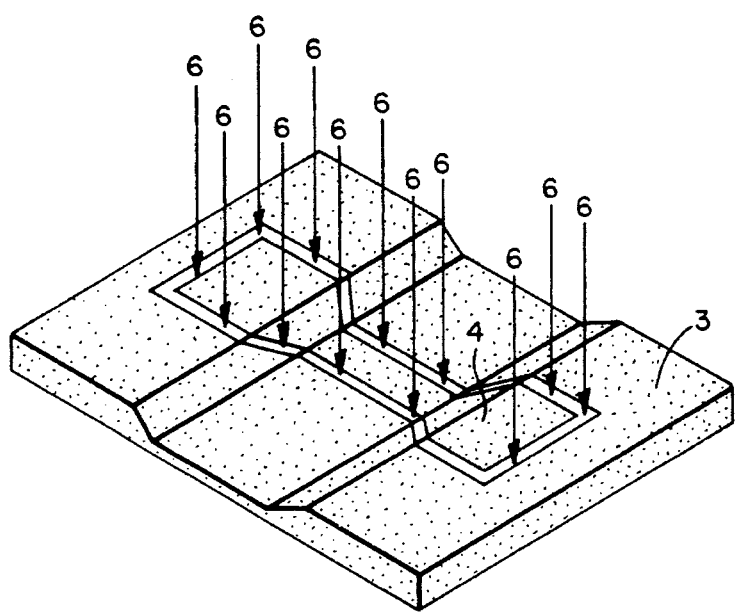
FIG. 3 is a perspective view of the molding provided with the chemical copper plating layer as illustrated in FIG. 2, from which the thin chemical copper plating film has been removed along the contour of an insulating portion by irradiation with YAG laser to thereby form a circuit pattern.

On the molding having its surface covered with the thin metal film (FIG. 2), the contour of a portion to be formed into an insulating circuit is irradiated with laser beams having their output suitably regulated to thereby selectively scatter off the thin metal film thereat, so that a circuit pattern of thin metal film is formed in which the insulating circuit portion is surrounded by a closed insulating circuit (FIG. 3). The employed laser is, for example, YAG laser or carbon dioxide laser, and has a wavelength lying in the infrared region. A predetermined circuit pattern is selectively irradiated with the laser by means of a laser marker provided with computer-aided X- and Y-direction scanning mechanism. When it is needed to form a circuit on a complicated three-dimensional molding, laser beams may three-dimensionally be guided by an optical fiber, a prism or the like and regulated by a computer so as to accurately irradiate a given three-dimensional zone. Moreover, the three-dimensional irradiation may be effected by the use of the laser marker provided with X- and Y-direction scanning mechanism in combination with a table having five axes, i.e., X-, Y- and Z-direction, rotation and inclination axes, synchronously moved by a computer. This method has an advantage that pattern formation and correction can easily be performed merely by changing a graphic program for laser irradiation zone.

Figure 4:
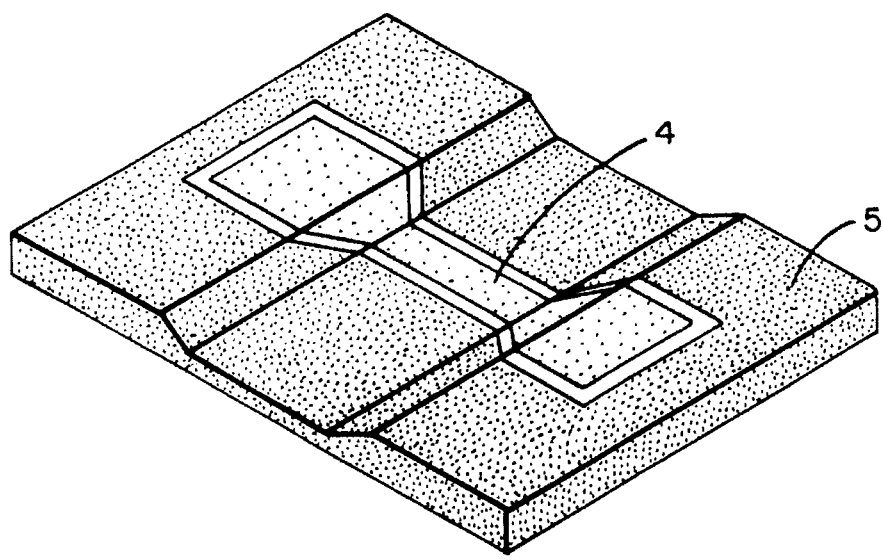
FIG. 4 is a perspective view of the molding provide with the circuit pattern as illustrated in FIG. 3, the conductive circuit portion of which has been electroplated with copper to thereby form a circuit composed of a metal layer having a desired thickness.

The obtained molding having the circuit pattern formed of the thin metal film; as it is, can be used as a circuit component, depending on the purpose of the use thereof. However, generally, circuits each having a thin film of less than 2 μmin thickness as mentioned above are often unsuitable in the use as a circuit component from the viewpoint of the conductivity and the damage and burnout caused by friction, etc., during the use. It is generally believed that the thickness of such a thin film should be at least 10 μm. Accordingly, in the present invention the conductive circuit portion of the circuit pattern is further electroplated so as to add a metal layer until the above film plus this layer has the desired thickness (for example, 10 to 100 μm), thereby forming the desired conductive circuit (FIG. 4). The conventional electroplating method can be applied to the above addition of the metal layer, because the previously formed circuit pattern has a conductivity which is satisfactory for electroplating.

Figure 5:
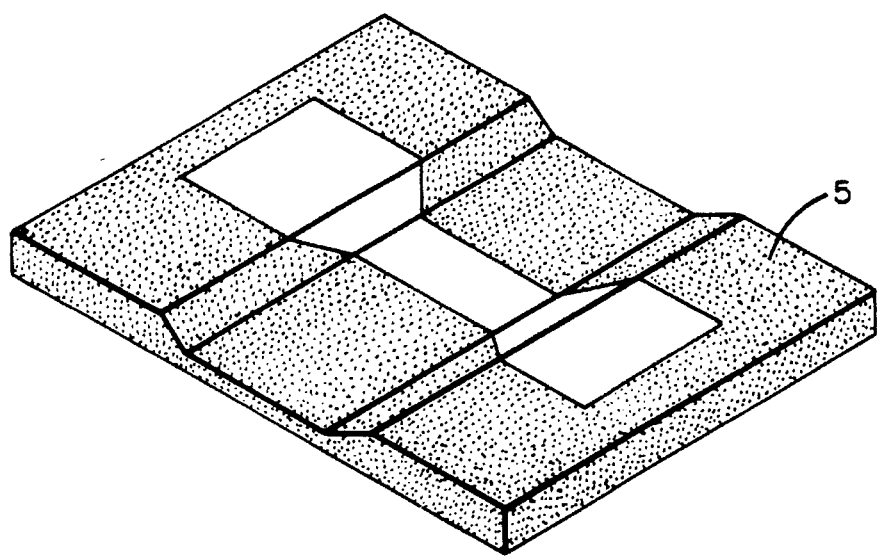
FIG. 5 is a perspective view of the electroplated molding as illustrated in FIG. 4 on which flash etching has been performed to remove the chemical copper plating layer remaining on the insulating portion.

The resultant molding having the conductive circuit provided with the additional metal layer and having the insulating portion covered with the remaining chemical plating layer is, directly or after application of an etching resist to only the conductive circuit portion by electrodeposition as required depending on the purpose of the use, subjected to flash etching, namely, dissolution and removal of the chemical plating layer remaining on the insulating portion by the use of a chemical plating etchant. Thus, a final circuit is formed (FIG. 5). Conventional metal etchants (for example, aqueous solution of iron chloride) may be used in the above flash etching. When the etching resist has been applied by electrodeposition, the resist is stripped off after the removal of the chemical plating layer from the insulating portion.

In the present invention, it is not necessary to conduct complicated composite molding. Further, not only troublesome operation in a dark room such as circuit-patternwise exposure and development as required when a photoresist is applied can be dispensed with but also the deterioration of appearance, configuration and insulation caused by the damage to the substrate molding by the irradiation with laser beams can be avoided. Still further, it is not necessary to irradiate the whole insulating portion with laser beams. Thus, a molding provided with a desired accurate conductive circuit can be obtained by the above simple process with economic advantage.

EXAMPLE

An embodiment of the present invention will be described below with reference to the drawings, which should not be construed as limiting the scope of the invention.

EXAMPLE 1

Figure 1:
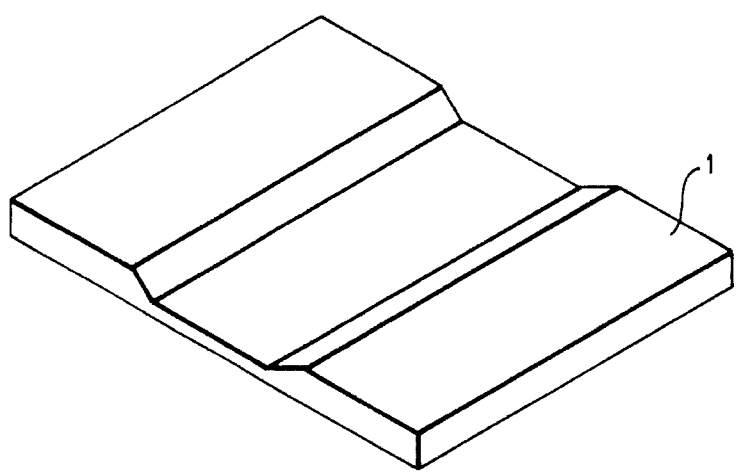
FIG. 1 is a perspective view of a molding as a substrate which is worked into a component having a three-dimensional circuit formed therein as one embodiment of the present invention.

A resin composition fit for metal adherence (plating) based on liquid crystal polyester (trade name "Vectra", produced by Polyplastics Co., Ltd.) was injection molded, thereby obtaining a three-dimensional molding 1 (FIG. 1). The molding 1 was defatted, and substantially the whole surface of the molding 1 was etched with an aqueous KOH solution, neutralized with an aqueous HCl solution, and washed. Thereafter, catalyst (trade name "Catalyst A-30", produced by Okuno Chemical Industry Co., Ltd.) was applied to thereby activate the surface of the molding 1, and the molding 1 was immersed in a chemical copper plating solution (trade name "OPC-750", produced by Okuno Chemical industry Co., Ltd.) to thereby provide the surface of the molding 1 with a chemical copper plating layer 2 having a thickness of 0.6 µm. The plated molding was washed well, and dried (FIG. 2).

The molding having its surface provided with a chemical copper plating layer (FIG. 2) was irradiated with YAG laser 6 having a power of 0.5 W, thereby removing the chemical copper plating layer along the contour of an insulating portion. Thus, a circuit pattern 3 was formed (FIG. 3).

The molding provided with the circuit pattern (FIG. 3) was electroplated with copper, thereby obtaining a molding having its conductive circuit portion 5 coated with a copper film of 30 µm in thickness and having its insulating portion covered with the remaining chemical copper plating layer 4 (FIG. 4).

The above molding still having its insulating portion covered with the remaining chemical copper plating layer 4 was immersed in an aqueous iron (III) chloride solution, thereby dissolving away the chemical copper plating layer 4. Thus, a circuit molding having an accurate three-dimensional conductive circuit portion 5(FIG. 5) was obtained.

What I claim is:

1. A process for forming an electrical circuit component comprising the steps of:
   (a) forming an initial metal layer on a surface of a synthetic plastics substrate;
   (b) irradiating the initial metal layer with laser light along a closed path so as to remove the initial metal layer therealong and establish (i) an insulating region covered by a first portion of said initial metal layer which is bounded by said closed path, and (ii) a conducting region covered by a second portion of said initial metal layer which surrounds said closed path and said insulating region established thereby;
   (c) electroplating a further metal layer over said second portion of said initial metal layer of said conducting region; and
   (d) removing said first portion of said initial metal layer of said insulating region to thereby expose a corresponding surface portion of said synthetic plastics substrate.

2. The process of claim 1, wherein step (a) is practiced to form said initial metal layer having a thickness from 0.2 to 2 µm.

3. The process of claim 1, wherein step (a) is practiced to form said initial metal layer having a thickness from 0.3 to 1 µm.

4. The process of claim 1, wherein step (d) includes the sequential steps of:
   coating the further metal layer formed over said second portion of said initial metal layer with a resist material;
   etching said first portion of said initial metal layer so as to remove said first portion of said initial metal layer from said insulating region, and
   removing the resist material from the further metal layer.

5. The process of claim 1, wherein the surface of the synthetic plastics substrate on which the initial metal layer is formed has three-dimensional surface contours.

6. The process of claim 1, wherein the initial metal layer is formed on the surface of the synthetic plastics substrate by electroless plating, sputtering, vacuum evaporation or ion plating.

7. The process of claim 1 or 2, wherein said second portion of said initial metal layer and said further metal layer on said conductive region collectively have a thickness from 10 to 100 µm.

8. The process of claim 1, wherein step (d) is practiced after step (c).

* * * * *